United States Patent
Adachi et al.

(10) Patent No.: US 11,476,148 B2
(45) Date of Patent: Oct. 18, 2022

(54) WAFER SEPARATING APPARATUS, AND WAFER SEPARATING METHOD

(71) Applicant: NISSIN ION EQUIPMENT CO., LTD., Koka (JP)

(72) Inventors: Masakazu Adachi, Koka (JP); Shinsuke Inoue, Koka (JP)

(73) Assignee: NISSIN ION EQUIPMENT CO., LTD., Koka (JP)

( * ) Notice: Subject to any disclaimer, the term of this patent is extended or adjusted under 35 U.S.C. 154(b) by 0 days.

(21) Appl. No.: 17/194,884

(22) Filed: Mar. 8, 2021

(65) Prior Publication Data

US 2021/0391202 A1    Dec. 16, 2021

(30) Foreign Application Priority Data

Jun. 15, 2020  (JP) .............................. JP2020-103145

(51) Int. Cl.
*H01L 21/683* (2006.01)

(52) U.S. Cl.
CPC ................................ *H01L 21/6833* (2013.01)

(58) Field of Classification Search
CPC .................................................. H01L 21/6833
See application file for complete search history.

(56) References Cited

U.S. PATENT DOCUMENTS

| | | | | |
|---|---|---|---|---|
| 5,459,632 | A * | 10/1995 | Birang | H02N 13/00 307/130 |
| 5,684,669 | A * | 11/1997 | Collins | H02N 13/00 361/234 |
| 6,313,469 | B1 * | 11/2001 | Tamai | H01L 21/68728 250/442.11 |
| 8,270,142 | B2 | 9/2012 | Lee et al. | |
| 9,011,602 | B2 | 4/2015 | Hao | |
| 11,037,815 | B2 | 6/2021 | Sasaki et al. | |
| 2019/0074209 | A1 | 3/2019 | Sasaki et al. | |

FOREIGN PATENT DOCUMENTS

| | | |
|---|---|---|
| JP | 2002-299424 A | 10/2002 |
| JP | 2003-142553 A | 5/2003 |
| JP | 2009-094147 A | 4/2009 |
| JP | 2010-040822 A | 2/2010 |
| JP | 2012-511831 A | 5/2012 |
| JP | 2012-516563 A | 7/2012 |
| JP | 2019-046997 A | 3/2019 |
| WO | 2019-106979 A1 | 6/2019 |

* cited by examiner

*Primary Examiner* — Scott Bauer
(74) *Attorney, Agent, or Firm* — Sughrue Mion, PLLC

(57) ABSTRACT

A wafer separating apparatus and method are provided. The apparatus includes an electrostatic chuck, a separation structure and a control device. The electrostatic chuck electrostatically supports a wafer during wafer processing using a voltage having a polarity. The separation structure mechanically separate the wafer from the electrostatic chuck. The control device controls the electrostatic chuck to, after the wafer processing is completed, reduce a magnitude of the voltage with the polarity while the separation structure applies a force to the wafer to separate the wafer from the electrostatic chuck.

16 Claims, 7 Drawing Sheets

WAFER SEPARATING APPARATUS, AND WAFER SEPARATING METHOD

CROSS-REFERENCE TO RELATED APPLICATION

This application claims priority under 35 USC § 119 to Japanese Patent Application No. 2020-103145, filed on Jun. 15, 2020, in the Japanese Patent Office (JPO), the entire contents of which are incorporated by reference herein in its entirety.

BACKGROUND

1. Field

The present disclosure relates to an apparatus and method for, after processing a wafer electrostatically attracted and retained on an electrostatic chuck, separating the processed wafer from the electrostatic chuck.

2. Description of the Related Art

When separating a processed wafer from an electrostatic chuck, a residual electrostatic attraction and retention force is often a problem. A large residual electrostatic attraction is often a problem. A large residual electrostatic attraction and retention force can lead to a situation where the wafer is forcibly separated from the electrostatic chuck, causing the occurrence of j umping or breaking of the wafer.

One method to reduce the residual electrostatic attraction and retention force is to, after stopping supply of an electrostatic attraction and retention voltage, apply a voltage having a same polarity as that of the electrostatic attraction and retention voltage but at a lesser magnitude, i.e. to reduce the magnitude of the voltage. However, although the residual electrostatic attraction and retention force may be reduced by applying a relatively small voltage of the same polarity, a certain level of waiting time occurs until the residual electrostatic attraction and retention force is sufficiently reduced.

SUMMARY

It is an aspect to provide a wafer separating apparatus and a wafer separating method capable of quickly separating a wafer from an electrostatic chuck.

According to an aspect of one or more embodiments, there is provided a wafer separating apparatus comprising an electrostatic chuck that electrostatically attracts and retains a wafer in a state in which an electrostatic attraction and retention voltage is applied to the wafer during wafer processing; a separation structure that is configured to separate the wafer from the electrostatic chuck; and a control device that is configured to control the electrostatic chuck and to control the separation structure, wherein the control device is configured to control the electrostatic chuck to, after stopping the electrostatic attraction and retention voltage, apply a voltage having a same polarity as a polarity the electrostatic attraction and retention voltage and a smaller magnitude than a magnitude of the electrostatic attraction and retention voltage, while the separation structure applies a force to the wafer to separate the wafer from the electrostatic chuck.

According to another aspect of one or more embodiments, there is provided a wafer separating method comprising after performing wafer processing in a state in which a wafer is electrostatically attracted and retained on an electrostatic chuck by an electrostatic attraction and retention voltage, applying a voltage having a same polarity as a polarity of the electrostatic attraction and retention voltage and a smaller magnitude than a magnitude of the electrostatic attraction and retention voltage, while applying a force to the wafer to separate the wafer from the electrostatic chuck.

According to yet another aspect of one or more embodiments, there is provided an apparatus comprising an electrostatic chuck configured to electrostatically support a wafer during wafer processing using a voltage having a polarity; a separation structure configured to mechanically separate the wafer from the electrostatic chuck; and a control device configured to control the electrostatic chuck to, after the wafer processing is completed, reduce a magnitude of the voltage with the polarity while the separation structure applies a force to the wafer to separate the wafer from the electrostatic chuck.

BRIEF DESCRIPTION OF THE DRAWINGS

The above and other aspects will be more clearly understood from the following detailed description, taken in conjunction with the accompanying drawings, in which:

FIGS. 1A and 1B are schematic views showing a wafer separating apparatus according to an embodiment, wherein FIG. 1A shows a state during a period during which a wafer is subjected to ion implantation processing, and FIG. 1B shows a state during a period during which wafer separation is performed after completion of the ion implantation processing for the wafer;

FIGS. 2A-2B are explanatory diagrams of transfer of the wafer to a transport arm, wherein FIG. 2A shows a state at a time when support by a clamp mechanism is released, and FIG. 2B shows a state at a time when the transport arm is turned such that two wafer support claws of the transport arm are positioned beneath an outer peripheral bottom edge of the wafer;

FIGS. 3A-3C are explanatory diagrams of an operation for wafer separation, wherein FIG. 3A, FIG. 3B and FIG. 3C show, respectively, a state at a time when supply of an electrostatic attraction and retention voltage is stopped, a state during a period during which the clamp is released, and a force is applied to an outer peripheral end of the wafer by one of the wafer support claws, and a state at a time when wafer separation is completed;

FIGS. 5A-5C are schematic views of some modifications of the configuration for pushing up one end of the wafer, wherein FIG. 5A, FIG. 5B and FIG. 5C show, respectively, a configuration using a pin on a wall surface of a vacuum chamber, a configuration using a pin on a platen driving shaft, and a configuration using two cushioning members formed to have different height dimensions and provided, respectively, on two support claws disposed at a same height position;

DETAILED DESCRIPTION

Figure 1A:
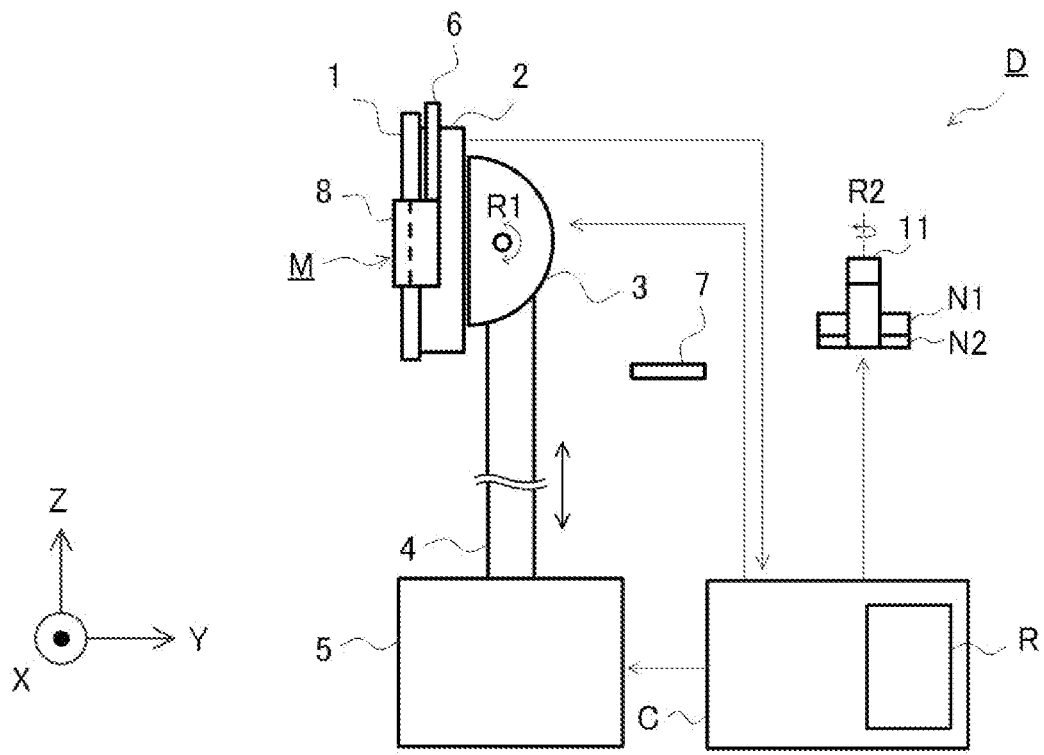

Various example embodiments will be described more fully hereinafter with reference to the accompanying drawings, in which embodiments are shown.

As one measure against the jumping or breaking of a wafer, in an electrostatic chuck for electrostatically attracting and retaining a wafer in a state in which a DC electrostatic attraction and retention voltage is applied to an electrode thereof during wafer processing, after stopping supply of the electrostatic attraction and retention voltage, a voltage having a same polarity as that of the electrostatic attraction and retention voltage and a magnitude of 40% to 60% of the electrostatic attraction and retention voltage may be applied to the electrode, thereby reducing the residual electrostatic attraction and retention force.

Although the residual electrostatic attraction and retention force may be reduced by applying a relatively small voltage of the same polarity, a certain level of waiting time occurs until the residual electrostatic attraction and retention force is sufficiently reduced. It thus would be advantageous to more quickly separate the wafer from an electrostatic chuck.

The wafer separating apparatus according to one or more embodiments includes an electrostatic chuck, a separation structure, and a control device. The electrostatic chuck electrostatically attracts and retains a wafer in a state in which a DC electrostatic attraction and retention voltage is applied thereto during wafer processing. The separation structure separates the wafer. The control device controls the electrostatic attraction and retention voltage and the separation structure. The control device is configured to, after stopping the electrostatic attraction and retention voltage, apply a voltage having a same polarity as that of the electrostatic attraction and retention voltage and a smaller magnitude than that of the electrostatic attraction and retention voltage, while causing the separation structure to apply a force to the wafer so as to separate the wafer from the electrostatic chuck.

If a force is merely applied to the wafer so as to separate the wafer from the electrostatic chuck using the separation structure, i.e., without reducing the voltage, a large force must be applied to counteract a force generated by the electrostatic attraction and retention voltage, and there is a concern that the jumping or breaking of the wafer may occur due to a large residual electrostatic attraction and retention force.

On the other hand, reducing the voltage as in the related art involves the occurrence of a waiting time until the residual electrostatic attraction and retention force is sufficiently reduced.

In view of a phenomenon that the residual electrostatic attraction and retention force sharply decreases after the wafer starts being separated from the electrostatic chuck, the control of applying a force for wafer separation to the wafer, while applying a voltage having the same polarity as that of and a smaller magnitude than that of the electrostatic attraction and retention voltage during the wafer processing is employed. This control makes it possible to more quickly reduce the residual electrostatic attraction and retention force, and thus more quickly separate the wafer from the electrostatic chuck.

Figure 1B:
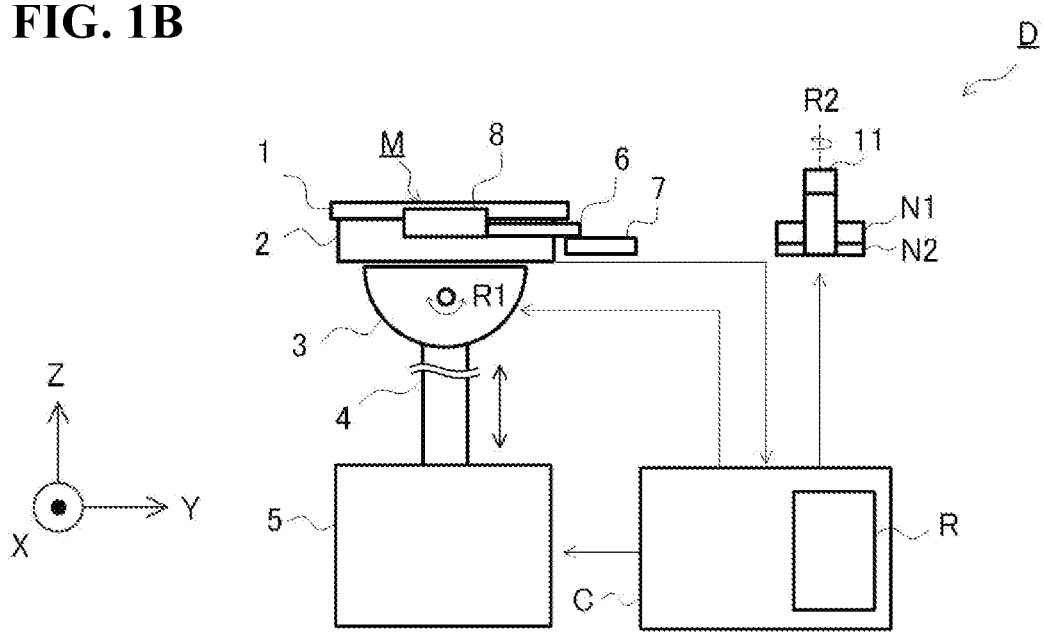
Figure 2A:
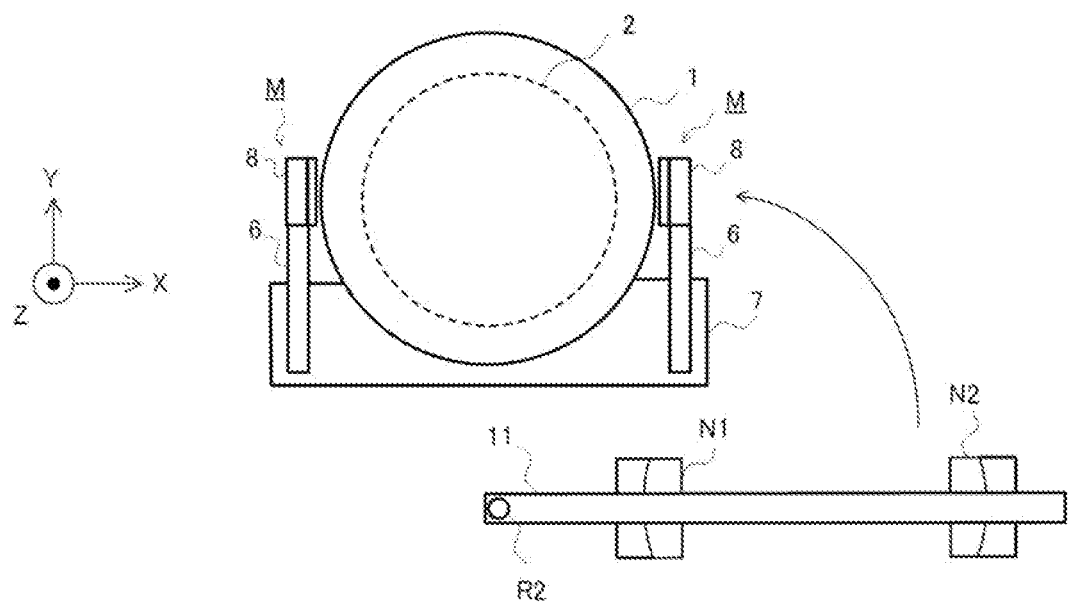
Figure 2B:
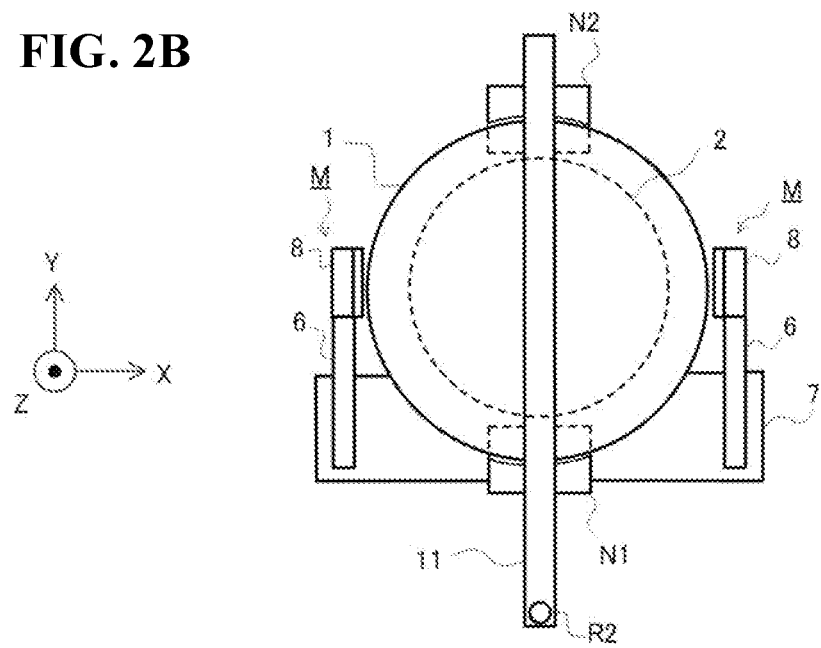

FIGS. 1A-1B are schematic views showing a wafer separating apparatus according to an embodiment, and FIGS. 2A-2B are explanatory diagrams of transfer of the wafer to a transport arm. Based on FIGS. 1A-1B and 2A-2B, the configuration of a wafer separating apparatus D according to an embodiment will be described.

The wafer separating apparatus D additionally serves as a part of an ion implanter used for ion implantation processing of the wafer.

FIG. 1A shows a state during a period during which a wafer 1 is subjected to ion implantation processing. The wafer 1 is supported by an electrostatic chuck 2 in a state in which a given electrostatic attraction and retention voltage is applied to the electrostatic chuck 2 having a unipolar or bipolar electrode.

In addition to the electrostatic chuck 2, the wafer 1 is supported by a clamp mechanism M at an outer periphery end thereof.

Although the wafer 1 is assumed to be a semiconductor wafer such as a silicon (Si) wafer or a silicon carbide (SiC) wafer, embodiments are not limited thereto, and any type of wafer may be used as long as the wafer is capable of being electrostatically attractable and retainable by the electrostatic chuck 2. Further, although the following description will be made by taking ion implantation processing as an example, embodiments are not limited thereto. The processing to be applied to the wafer 1 is not particularly limited, but may be any other processing such as film formation or sputtering.

A spot-shaped ion beam (not shown) is scanned in a reciprocating manner in a direction (X direction) perpendicular to the surface of the drawing sheet. In order to allow the entire surface of the wafer 1 to be irradiated with the scanned ion beam, the wafer 1 is mechanically scanned in a reciprocating manner in an up-down direction (Z direction) along the drawing sheet to cut across the ion beam.

Specifically, the electrostatic chuck 2 is supported by a tilt mechanism 3, and a shaft 4 coupled to the tilt mechanism 3 is moved in the up-down direction (Z direction) along the drawing sheet by a driving source 5. In this way, the mechanical scan of the wafer 1 is carried out.

For transfer of the wafer 1 to/from the electrostatic chuck 2, a transport arm 11 turnable about an axis R2 is used. The transport arm 11 has a first support claw N1 and a second support claw N2 for supporting an outer peripheral bottom edge of the wafer 1. At least one of the first and second support claws N1, N2 may constitute a separation structure. The first and second support claws N1, N2 are disposed, respectively, at different height positions in the up-down direction (Z direction) along the drawing sheet. While two support claws are illustrated, this is only an example and in some embodiments more than two support claws may be provided.

The tilt mechanism 3 is configured to be rotatable about an axis R1 by a driving source (not shown). The clamp mechanism M comprises a plurality of link mechanisms 8, and a plurality of actuating rods 6 each for actuating a respective one of the link mechanisms 8. For example, in some embodiments, two link mechanisms 8 and two actuating rods 6 may be provided. However, this is only an example and, in some embodiments, more than two link mechanisms 8 and more than two actuating rods 6 may be provided. When the tilt mechanism 3 is rotated from the position illustrated in FIG. 1A, the electrostatic chuck 2 is rotated to a horizontal posture as shown in FIG. 1B, and the actuating rods 6 are brought into contact with a release member 7. Thus, a force is applied to the actuating rods 6 in the up direction (Z direction) along the drawing sheet, so that the link mechanisms 8 are actuated to release the clamp mechanism M.

The release member 7 is a member which is not interlocked with the swing movement of the tilt mechanism 3, and may be composed of any other member as long as the release member 7 is disposed inside a processing chamber for performing ion implantation processing therein.

Each of the link mechanisms 8 has a claw (not shown) attached thereto to protrude toward the surface of the wafer. When the tilt mechanism 3 is in the state illustrated in FIG.

1A, the wafer 1 is biased toward a side of the electrostatic chuck 2 by the claws of the link mechanisms 8. On the other hand, in the position illustrated in FIG. 1B, the link mechanisms 8 are released and the claws of the link mechanisms 8 are separated from the surface of the wafer 1.

The wafer separating apparatus D comprises a control device C. The control device C is a device equipped with a central processing unit (CPU) and a storage R that stores program code which, when executed by the CPU, is configured to control operations of the driving source 5 for moving the shaft 4 up and down, the driving source (not-illustrated) for swinging the tilt mechanism 3 about the axis R1, and a driving source (not-illustrated) for turning the transport arm 11 about the axis R2. The control device C is configured to compare a measurement result of a capacitance accumulated between the wafer 1 and the electrode of the electrostatic chuck 2 with reference data stored in the storage R of the control device C, and control each of the driving sources according to a result of the comparison. The storage R may be a memory such as a RAM or may be a hard disk drive or solid state drive.

FIGS. 2A-2B depicts the wafer 1 when viewing the wafer 1 from above. FIG. 2A corresponds to the posture of the electrostatic chuck 2 described in FIG. 1B, wherein the support of the wafer 1 by the clamp mechanism M is released. Subsequently, the transport arm 11 is turned about the axis R2, and the support claws N1, N2 are positioned beneath the outer peripheral bottom edge of the wafer 1, as shown in FIG. 2B.

It should be noted here that the turning of the transport arm 11 may be performed before the release of the wafer support by the clamp mechanism M. This is more advantageous to shortening a time period required for an operation for wafer separation. The transport arm 11 is disposed at a position higher than the clamp mechanism M (see FIG. 1B), and the support claws N1, N2 are attached to the transport arm 11 at respective positions which are free of physical interference with the clamp mechanism M during the turning.

Further, a turning angle of the transport arm 11 may be changed according to the apparatus configuration. For example, the turning angle may be set to a certain angle such as 180° or 90°, according to a wafer transfer location. Similarly, a turning direction of the transport arm 11 may also be changed according to the apparatus configuration.

Figure 3A:
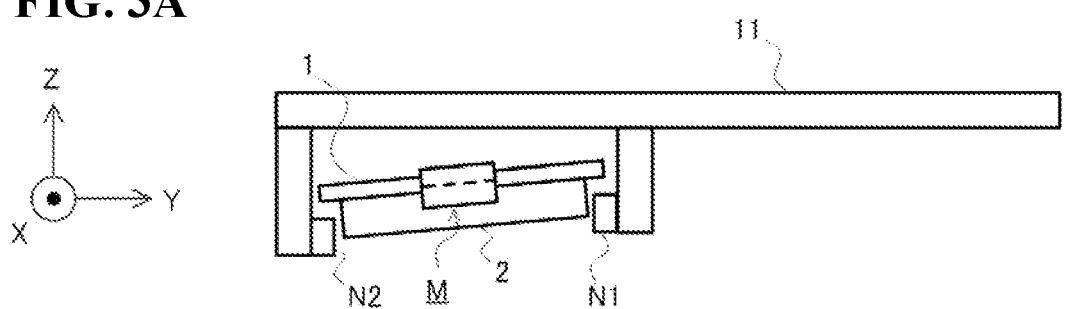
Figure 3B:
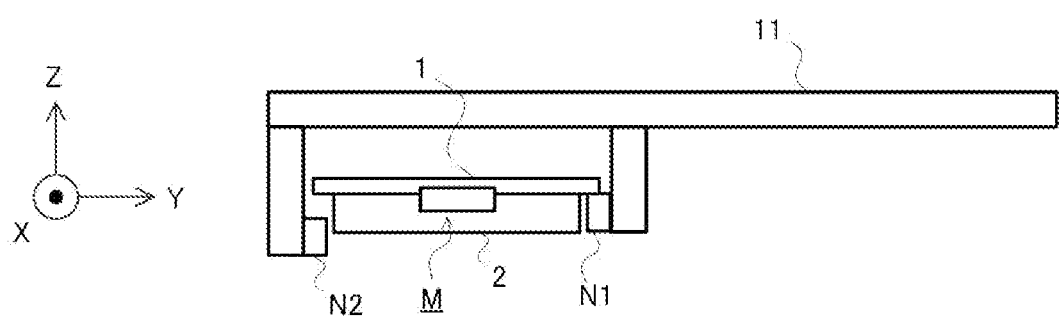
Figure 3C:
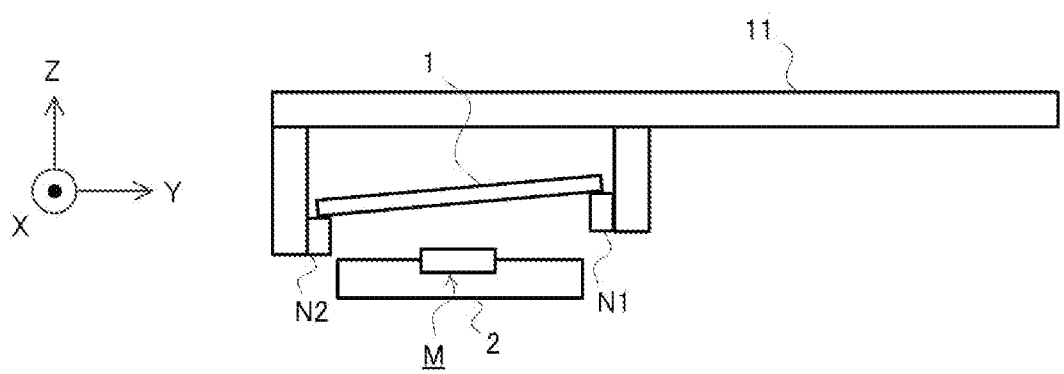

FIGS. 3A-3C are explanatory diagrams of an operation for wafer separation. Upon completion of the wafer processing, supply of the electrostatic attraction and retention voltage to the electrostatic chuck 2 is stopped. FIG. 3A depicts a state at a time when the electrostatic attraction and retention voltage is stopped. Depending on the type of wafer or processing to be applied to a wafer, deformation may occur in the wafer electrostatically attracted and retained by the electrostatic chuck 2.

For example, when a wafer is subjected to high-temperature processing, deformation occurring in the wafer will be large. When the supply of the electrostatic attraction and retention voltage to the electrostatic chuck 2 is stopped, there is a timing when a residual electrostatic attraction and retention force sharply decreases and becomes very small even for a very short period of time. There is a concern that, at this timing, a stress on the wafer due to the deformation is released to cause jumping of the wafer. However, such a concern may be addressed by keeping the wafer 1 in a state of being biased toward a side of the electrostatic chuck 2 by the clamp mechanism M.

In FIG. 3A, the electrostatic chuck 2 is in a slightly obliquely inclined state, and the wafer 1 is biased toward a side of the electrostatic chuck 2 by the clamp mechanism M.

In FIG. 3A, the transport arm 11 is in a state in which the transport arm 11 has already been turned, and the support claws N1, N2 are positioned beneath the outer peripheral bottom edge of the wafer 1. However, it is noted that, in some embodiments, the turning of the transport arm 11 may be performed after releasing the support by the clamp mechanism M, as mentioned above.

After the supply of the electrostatic attraction and retention voltage to the electrostatic chuck 2 is stopped, the electrostatic chuck 2 is set to a horizontal posture as shown in FIG. 3B and then the support of the wafer 1 by the clamp mechanism M is released. Simultaneously with or after the release of the clamp mechanism M, the outer peripheral end of the wafer 1 is brought into contact with the support claw N1 located at a height position higher than that of the support claw N2. While FIGS. 3A-3C illustrate the support claw N1 being in a higher position than the support claw N2, this is only an example and, in some embodiments, the support claw N2 may be in a higher position than the support claw N1. In such a case, simultaneously with or after the release of the clamp mechanism M, the outer peripheral end of the wafer 1 is brought into contact with the support claim N2.

Subsequently, the shaft 4 is moved downwardly, or the tilt mechanism 3 is swung in a clockwise direction, thereby applying a pushing force to the outer peripheral end of the wafer 1 using the support claw N1.

In this specification, the position of the electrostatic chuck in the up-down direction (Z direction) along the drawing sheet at this time is referred to as "first release position".

Simultaneously with or after the pushing operation to the outer peripheral end of the wafer 1, a voltage is applied to the electrode of the electrostatic chuck 2. In this specification, the voltage applied at this time is referred to as a "release voltage". The release voltage is a voltage having a same polarity as a polarity of a DC electrostatic attraction and retention voltage applied to the electrode of the electrostatic chuck 2 during the wafer processing, and a magnitude less than a magnitude of the electrostatic attraction and retention voltage, specifically, a magnitude of about 20 to 40% of the electrostatic attraction and retention voltage.

A set value of the release voltage may be a constant value, or may be approximately changed according to a type of the wafer 1 or the wafer processing. The set value of the release voltage may be preliminarily stored in the storage part R of the control device C, or may be appropriately input to the control device C by an operator of the apparatus or electronically input from a device outside the control device C.

During the pushing operation in FIG. 3B, measurement of a parameter related to the residual electrostatic attraction and retention force is performed. Specifically, measurement of a capacitance between the wafer 1 and an electrode of the electrostatic chuck 2 is performed. For example, in some embodiments, the capacitance may be measured by the control device C. The control device C operates to read a reference value from the storage part R, and compare the measured value with the reference value.

The reference value may vary according to the type of the wafer 1 or the wafer processing. With regard to the reference value, for example, the value of the capacitance may be measured under the condition that the wafer 1 is simply placed on the electrostatic chuck 2 applied with no voltage, and the reference value may be set according to the measured value.

When the control device C determines that the capacitance measured in FIG. 3B is equal to or less than the reference value, the electrostatic chuck 2 is moved downwardly as shown in FIG. 3C, to perform transfer of the wafer 1 to the transport arm 11. In this specification, the position of the electrostatic chuck 2 at this time is referred to as "second release position". Basically, when the electrostatic chuck 2 is at the second release position, the capacitance has a value infinitely close to zero. However, in the case where deformation occurs in the wafer 1, there sometimes occurs a situation where the edge of the wafer 1 is in contact with the electrostatic chuck 2, and thereby vary small capacitance may be measured.

After the electrostatic chuck 2 reaches the second release position illustrated in FIG. 3C, the electrostatic chuck 2 is further moved downwardly to a fully-separated position. Here, considering that an unexpected capacitance is likely to be measured due to large deformation of the wafer 1, the measurement of the capacitance may be continued even after the movement from the first release position to the second release position.

From a viewpoint of performing the wafer separation more safely, a second reference value other than the first reference value to be used at the first release position may be provided, and compared with the value of the capacitance measured at the second release position, and the electrostatic chuck 2 may be controlled to, after the measured value is determined to be equal to or less than the second reference value, to be moved to the fully-separated position.

Figure 4:
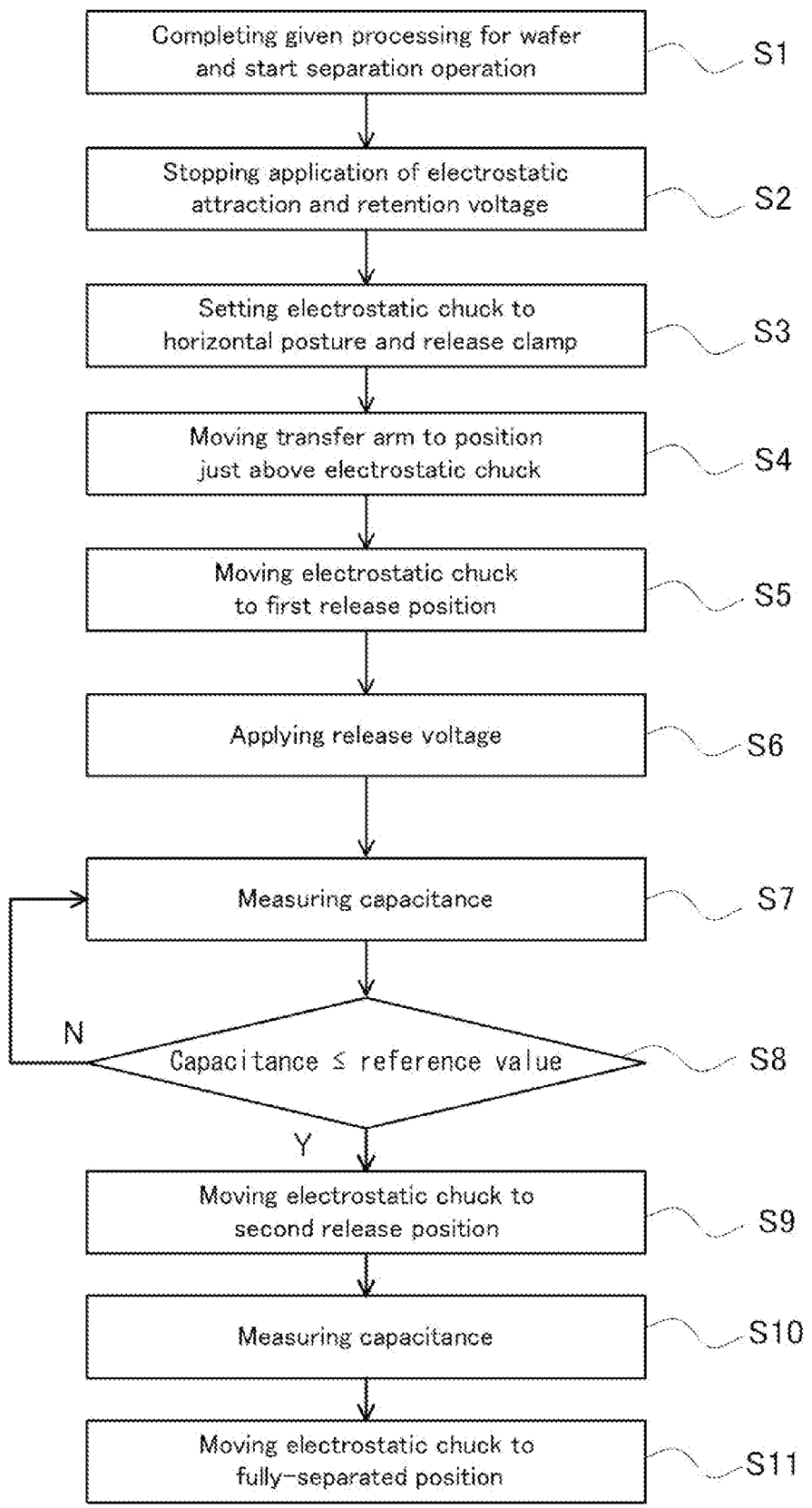
FIG. 4 is a flowchart of a wafer separating method according to an embodiment.

FIG. 4 is a flowchart illustrating an example of the aforementioned separation operation.

Based on FIG. 4, a flow of a sequence of steps for the separation operation will be briefly described.

In response to completion of processing for a wafer, the separation operation is started (process S1). Supply of the electrostatic attraction and retention voltage applied to the electrode of the electrostatic chuck is stopped (process S2). Subsequently, the electrostatic chuck is set to a horizontal posture, and then support of the wafer by the clamp mechanism is released (process S3). The transport arm is turned to a position just above the electrostatic chuck (process S4). The electrostatic chuck is moved to the first release position such that one end of the wafer is pushed up (process S5). Subsequently, the release voltage is applied to the electrode of the electrostatic chuck (process S6). The release voltage continues to be applied until a measured capacitance reaches a reference value. Thus, while the release voltage is applied, a capacitance between the wafer and the electrode of the electrostatic chuck is measured (process S7).

The measured capacitance is compared with the reference value to determine if the measured capacitance is less than or equal to the reference value (process S8). When the measured capacitance is greater than the reference value (S8, N), the capacitance between the wafer and the electrode of the electrostatic chuck continues to be measured while the release voltage continues to be applied; that is, the process returns to process S7. When the measured capacitance is equal to or less than the reference value (S8, Y), the electrostatic chuck is moved to the second release position (process S9). In other words, the release voltage continues to be applied until the capacitance reaches the reference value at which point the release voltage is no longer applied and the electrostatic chuck is moved to the second release position. After the electrostatic chuck reaches the second release position, the capacitance is again measured (process S10). In some embodiments, the measurement at the step S10 may be performed concurrently with the step S9.

Subsequently, after waiting for several seconds at the second release position, the electrostatic chuck is moved to the fully-separated position (process S11). In some embodiments, the measurement result at the process S10 may be compared with a second reference value, and, when the measurement result is equal to or less than the second reference value, the process proceeds to the process S11.

The process illustrated in FIG. 4 may be performed by the control device C or under control of the control device C. In some embodiments, each process step in FIG. 4 may be automatically triggered by using the control device C. In other embodiments, process step may be triggered by an operator of the apparatus. In such case, an interface such as a display for displaying a measured value of the capacitance may be provided such that the operator may input a control to move the electrostatic chuck.

In the embodiment illustrated in FIGS. 1A to 3C, the mechanism for separating the wafer 1 from the electrostatic chuck 2 includes the mechanism for moving the electrostatic chuck 2 and the support claws N1, N2 of the transport arm 11. However, the configuration of the separation structure is not limited to the configuration in FIGS. 1A-3C.

Figure 5A:
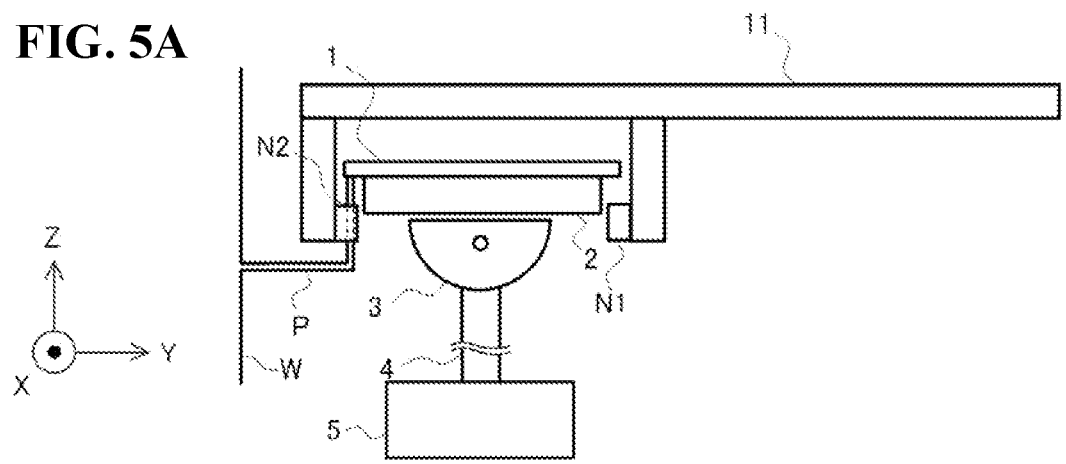
Figure 5B:
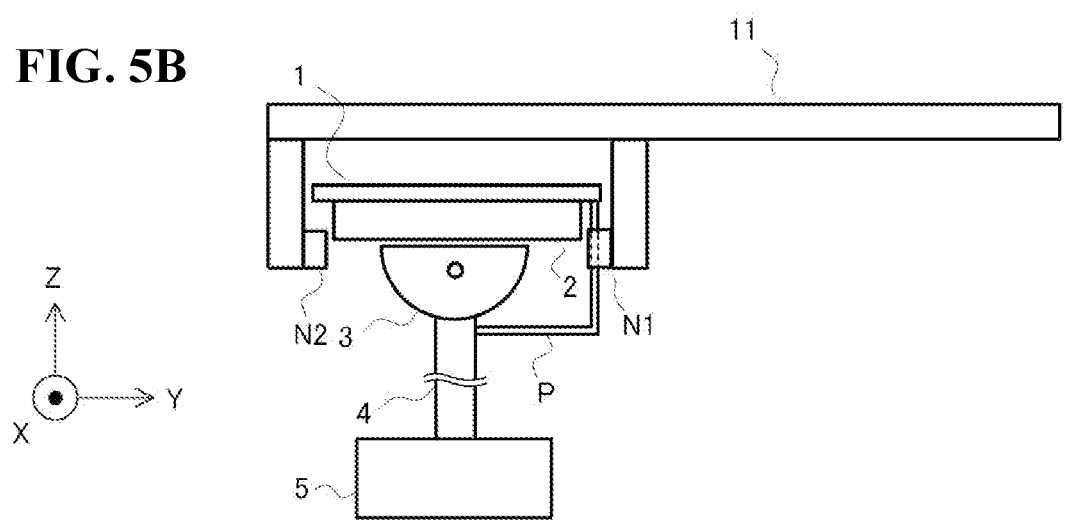
Figure 5C:
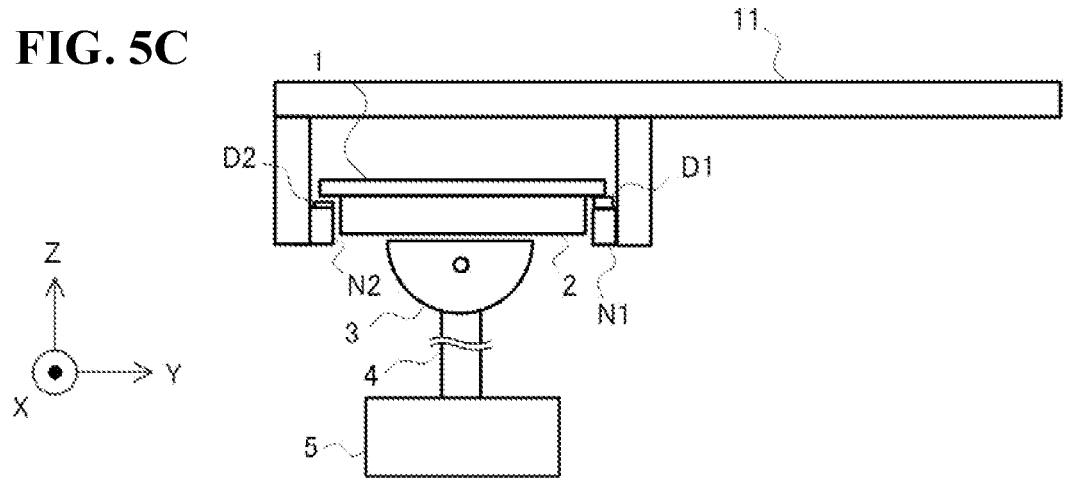

FIGS. 5A-5C are schematic views of some modifications of the configuration for pushing up one end of the wafer. For example, with regard to the configuration of the separation structure for pushing up one end of the wafer 1, in some embodiments as shown in FIG. 5A, a pin P may be provided on a wall surface W of a vacuum chamber, and the one end of the wafer 1 may be pushed up by the pin P, thereby carrying out the wafer separation. Alternatively, as shown in FIG. 5B, in other embodiments, the pin P may be attached to the shaft 4. Alternatively, as shown in FIG. 5C, in still other embodiments, the support claws N1, N2 may be disposed at the same height position, and two cushioning members D1, D2 attached to the support claws N1, N2, respectively may be formed to have different height dimensions.

Pushing of one end of the wafer by the pin or by one of the cushioning members may be effected by moving the shaft 4 downwardly, or by swinging the electrostatic chuck 2 using the tilt mechanism 3, in the same manner as that in the embodiments of FIGS. 1A-3C.

Differently from the embodiments illustrated in FIGS. 1A-5C, the wafer separating apparatus may be configured to simultaneously push up the outer peripheral end of the wafer at a plurality of positions along a radial direction of the wafer. In this case, for example, the support claws N1, N2 may be disposed at the same height position.

However, as compared with the technique of applying a force to a plurality of positions of the outer peripheral end of the wafer to realize the wafer separation, the technique of applying a force to one end of the wafer according to the embodiments of FIGS. 1A-5C is advantageous to reducing a force required for the wafer separation. Further, the residual electrostatic attraction and retention force sharply decreases just after the wafer is partly separated from the electrostatic chuck in the technique of applying a force to one end of the wafer according to the embodiments of FIGS. 1A-5C.

In view of these, the configuration in which a force is applied to one end of the wafer to gradually cause the wafer separation from the one end of the wafer toward the other end opposed in the radial direction makes the wafer separation more efficient than the configuration in which a force is applied to a plurality of positions of the outer peripheral end of the wafer to accomplish the wafer separation at once.

Figure 6:
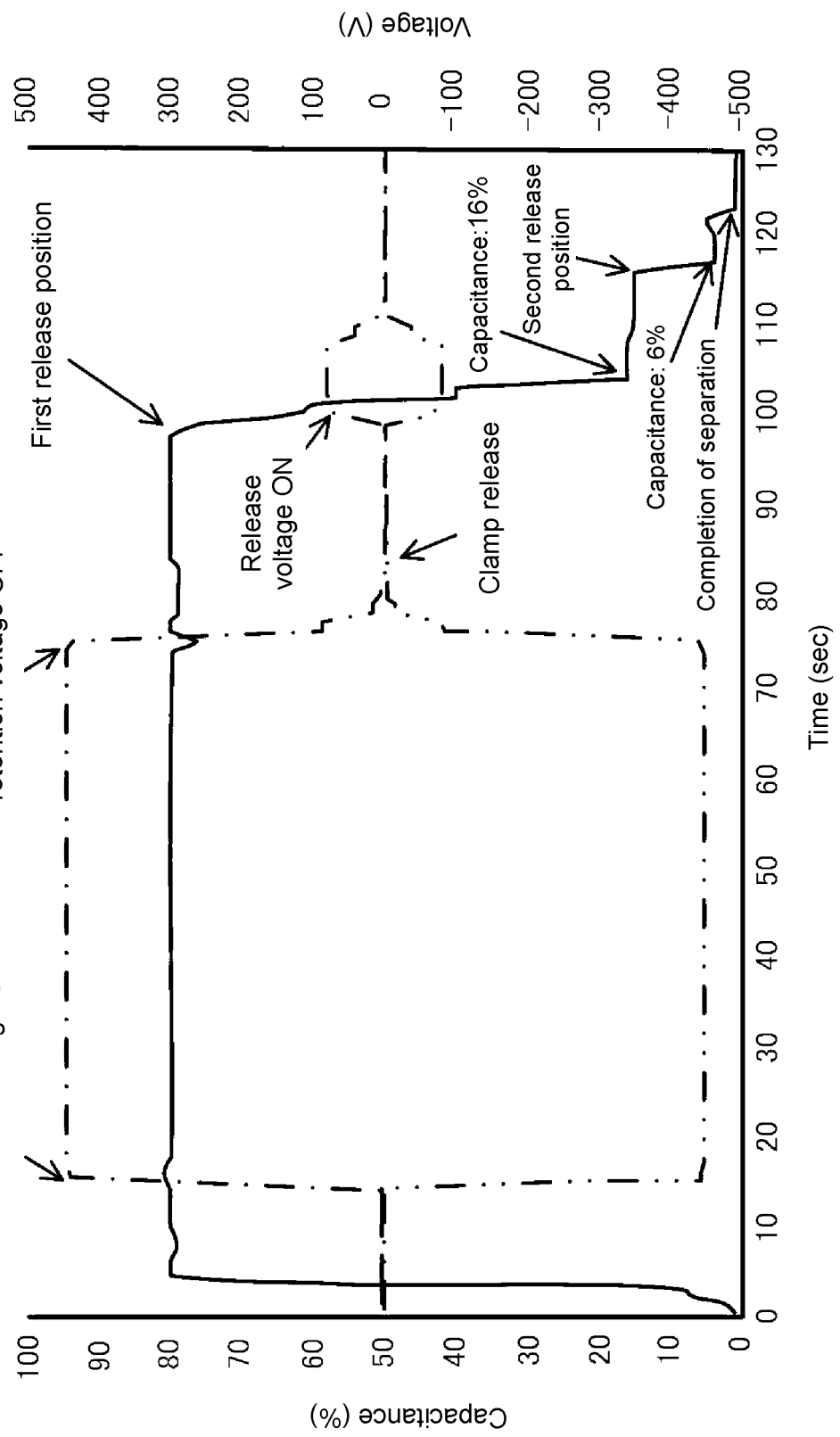
FIG. 6 is a graph showing a result of an experiment about separation of a silicon (Si) wafer.
Figure 7:
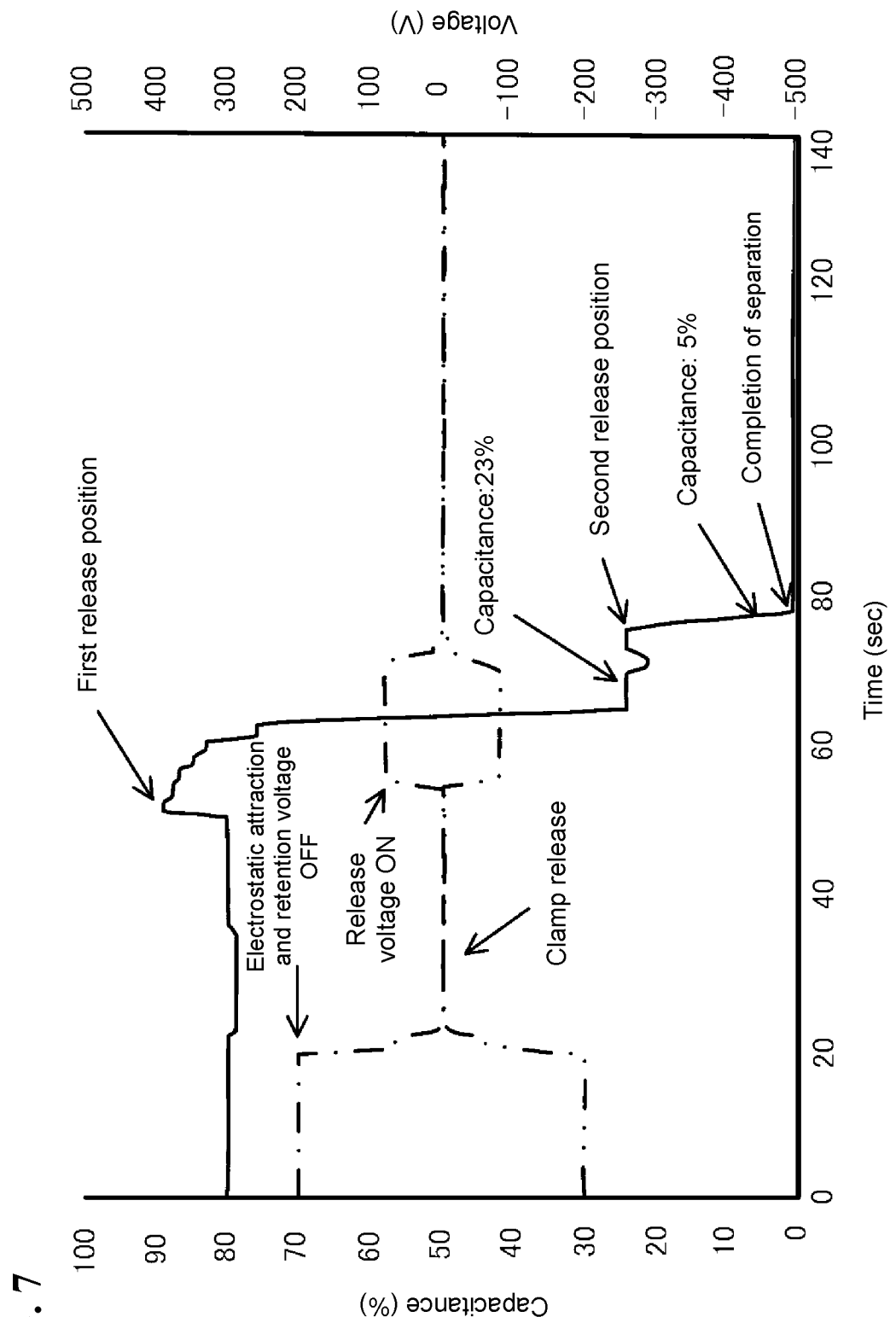
FIG. 7 is a graph showing a result of an experiment about separation of a silicon carbide (SiC) wafer.

FIG. 6 is a graph showing a result of an experiment about separation of a silicon (Si) wafer, and FIG. 7 is a graph showing a result of an experiment about separation of a silicon carbide (SiC) wafer. Graphs in FIGS. 6 and 7 show results of experiments using the technique of applying a force to one end of the wafer according to the embodiments of FIGS. 1A-3C. In each figure, a solid line represents a change in capacitance, and a one-dot chain line represents a change in voltage applied to a positive-side electrode of a bipolar electrostatic chuck. Further, the two-dot chain line represents a change in voltage applied to a negative-side electrode of the bipolar electrostatic chuck.

A wafer handled in FIG. 6 is a Si wafer. Wafer processing was performed in a state in which an electrostatic attraction and retention voltage of 450 V was applied to the bipolar electrostatic chuck to support the wafer by the electrostatic chuck, and then the wafer was separated from the electrostatic chuck by using the embodiment of FIGS. 1A-3C.

After stopping the electrostatic attraction and retention voltage, support of the wafer by the clamp mechanism was released, and the electrostatic chuck was moved to the first release position. At the first release position, a release voltage of ±80 V was applied.

In experiment illustrated in FIG. 6, the reference value of a capacitance at the first release position was set to 20%. After the capacitance was determined to decrease to 16% as shown in FIG. 6, the electrostatic chuck was moved to the second release position.

When waiting for several seconds at the second release position, the capacitance decreased to 6%, i.e., a value posing no problem for the wafer separation. Subsequently, the electrostatic chuck was moved from the second release position to the fully-separated position to complete the wafer separation operation.

A wafer handled in FIG. 7 is a SiC wafer. Wafer processing was performed in a state in which an electrostatic attraction and retention voltage of 200 V was applied to the bipolar electrostatic chuck to support the wafer by the electrostatic chuck, and then the wafer was separated from the electrostatic chuck by using the present invention.

After stopping the electrostatic attraction and retention voltage, support of the wafer by the clamp mechanism was released, and the electrostatic chuck was moved to the first release position. At the first release position, a release voltage of ±80 V was applied.

In the experiment illustrated in FIG. 7, the reference value of a capacitance at the first release position was set to 30%. After the capacitance was determined to decrease to 23% as shown in FIG. 7, the electrostatic chuck was moved to the second release position.

When waiting for several seconds at the second release position, the capacitance decreased to 5%, i.e., a value posing no problem for the wafer separation. Subsequently, the electrostatic chuck was moved from the second release position to the fully-separated position.

The reference value of the capacitance for a SiC wafer is set to 30% which is a value greater than the reference value for a Si wafer, i.e., 20%. This is because, as compared with the Si wafer, the SiC wafer has larger deformation, and thus a larger contact area with the electrostatic chuck.

It is to be understood that, in addition to the above, various other changes and modifications may be made, without departing from the spirit and scope of the appended claims.

For example, although the embodiments illustrated in FIGS. 1A-5C have been described based on an example where the clamp mechanism M is configured to be selectively opened and closed according to the posture of the electrostatic chuck, in some embodiments, a motor for actuating the link mechanisms of the clamp mechanism M may be provided to allow the clamp mechanism M to be selectively opened and closed, irrespective of the posture of the electrostatic chuck.

It should be noted that, if no jumping of a wafer occurs when stopping the electrostatic attraction and retention voltage, depending on the type of wafer or wafer processing, in some embodiments, the wafer separating apparatus may have a configuration that omits the clamp mechanism M.

Although the embodiments of FIGS. 1A-5C have been described based on an example where the parameter related to the residual electrostatic attraction and retention force is capacitance, in other embodiments another parameter may be used. For example, in some embodiments, a pressure sensor may be attached to the support claw N1 or the pin P for pushing up one end of the wafer at the first release position, to measure a pressure imposed on the support claw or the pin by the wafer.

Further, when employing the configuration in which the electrostatic chuck 2 is further swung in the clockwise direction using the tilt mechanism 3 at the first release position to push up one end of the wafer, in some embodiments, a load imposed on a motor serving as the driving source of the tilt mechanism may be monitored.

As described above, although the residual electrostatic attraction and retention force may be reduced by applying a relatively small voltage of the same polarity, as in a related art technique, a certain level of waiting time occurs until the residual electrostatic attraction and retention force is sufficiently reduced. Therefore, embodiments described here are directed to providing a wafer separating apparatus and a wafer separating method capable of more quickly separating a wafer from an electrostatic chuck.

The wafer separating apparatus according to one or more embodiments comprises an electrostatic chuck for electrostatically attracting and retaining a wafer in a state in which a DC electrostatic attraction and retention voltage is applied thereto during wafer processing; a separation structure for separating the wafer; and a control device for controlling the electrostatic attraction and retention voltage and the separation structure, wherein the control device is configured to, after stopping the electrostatic attraction and retention voltage, apply a voltage having a same polarity as that of the electrostatic attraction and retention voltage and a smaller magnitude than that of the electrostatic attraction and retention voltage, while causing the separation structure to apply a force to the wafer so as to separate the wafer from the electrostatic chuck.

If a force is merely applied to the wafer so as to separate the wafer from the electrostatic chuck using the separation structure, there is a concern that the jumping or breaking of the wafer occurs due to large residual electrostatic attraction and retention force.

On the other hand, the related art technique involves the occurrence of a waiting time until the residual electrostatic attraction and retention force is sufficiently reduced.

In view of a phenomenon that the residual electrostatic attraction and retention force sharply decreases after the wafer starts being separated from the electrostatic chuck, the control of applying a force for wafer separation to the wafer, while applying a voltage having the same polarity as that of and a smaller magnitude than that of the electrostatic attraction and retention voltage during the wafer processing is employed. This control makes it possible to more quickly reduce the residual electrostatic attraction and retention force, and thus to more quickly separate the wafer from the electrostatic chuck.

The separation structure may be configured to separate the wafer from one end thereof.

As compared with a configuration in which a force is applied to the entire surface of the wafer so as to attain the wafer separation, the magnitude of force required for the wafer separation is smaller when a force is applied to one end of the wafer. Further, the residual electrostatic attraction and retention force sharply decreases when the wafer is partly separated from the electrostatic chuck.

Therefore, a configuration in which the force is applied to one end of the wafer makes it possible to efficiently perform the wafer separation.

The control device may be configured to measure a parameter related to a residual electrostatic attraction and retention force which electrostatically attracts and retains the wafer, and to control, based on a result of the measurement, operation for the wafer separation by the separation structure.

The operation for the wafer separation may also be performed based on experimental rules. However, according to the configuration in which the control device measures the parameter, it becomes possible to more reliably prevent the jumping or breaking of the wafer during the wafer separation.

The wafer separating apparatus may comprise a clamp mechanism that mechanically supports the wafer with respect to the electrostatic chuck, wherein the control device is configured to release the support of the wafer by the clamp mechanism, after stopping supply of the electrostatic attraction and retention voltage.

When supply of the electrostatic attraction and retention voltage is stopped after completion of the wafer processing, the residual electrostatic attraction and retention force applied to the wafer sharply decreases even for a moment. If the wafer supported by the electrostatic chuck has a deformation, there is a concern that, when the residual electrostatic attraction and retention force sharply decreases, the stress of the wafer is released to cause the jumping of the wafer.

According to the inclusion of the claim mechanism, the wafer is supported by the clamp mechanism, so that it is possible to prevent the jumping of the wafer which would otherwise be caused by releasing the stress of the wafer.

The wafer separating method of one or more embodiments is designed to, after performing wafer processing in a state in which a wafer is electrostatically attracted and retained on an electrostatic chuck by applying a DC electrostatic attraction and retention voltage to the electrostatic chuck, separate the wafer from the electrostatic chuck. The wafer separating method comprises applying a voltage having a same polarity as that of and a smaller magnitude than that of the electrostatic attraction and retention voltage, while applying a force to the wafer so as to separate the wafer from the electrostatic chuck, after stopping supply of the electrostatic attraction and retention voltage.

If a force is merely applied to the wafer so as to separate the wafer from the electrostatic chuck using the separation structure, there is a concern that the jumping or breaking of the wafer occurs due to large residual electrostatic attraction and retention force.

On the other hand, the related art technique involves the occurrence of a waiting time until the residual electrostatic attraction and retention force is sufficiently reduced.

In view of the phenomenon that the residual electrostatic attraction and retention force sharply decreases after the wafer starts being separated from the electrostatic chuck, the control of applying a force for the wafer separation to the wafer, while applying a voltage having the same polarity as that of and a smaller magnitude than that of the electrostatic attraction and retention voltage during the wafer processing is employed. This control makes it possible to more quickly reduce the residual electrostatic attraction and retention force, and thus more quickly separate the wafer from the electrostatic chuck.

While various embodiments have been illustrated and described above, it will be apparent to those skilled in the art that modifications and variations may be made without departing from the scope defined by the appended claims.

What is claimed is:

1. A wafer separating apparatus comprising:
    an electrostatic chuck that electrostatically attracts and retains a wafer in a state in which an electrostatic attraction and retention voltage is applied to the wafer during wafer processing;
    a separation structure that is configured to separate the wafer from the electrostatic chuck; and
    a control device that is configured to control the electrostatic chuck and to control the separation structure,
    wherein the control device is configured to control the electrostatic chuck to, after setting the electrostatic attraction and retention voltage to zero, apply a voltage having a same polarity as a polarity the electrostatic attraction and retention voltage and a smaller magnitude than a magnitude of the electrostatic attraction and retention voltage, while the separation structure applies a force to the wafer to separate the wafer from the electrostatic chuck.

2. The wafer separating apparatus as recited in claim 1, wherein the force is applied to one end of the wafer.

3. The wafer separating apparatus as recited in claim 1, wherein the control device is configured to measure a parameter related to a residual electrostatic attraction and retention force, and to control, based on a result of the measurement, wafer separation by the separation structure.

4. The wafer separating apparatus as recited in claim 1, further comprising a clamp mechanism that supports the wafer with respect to the electrostatic chuck, wherein the control device is configured to control the clamp mechanism to release the support of the wafer by the clamp mechanism, after setting the electrostatic attraction and retention voltage to zero.

5. The wafer separating apparatus as recited in claim 1, wherein the electrostatic attraction and retention voltage is a DC voltage.

6. The wafer separating apparatus as recited in claim 1, wherein the control device comprises a central processing unit (CPU) and a memory storing computer code which, when executed by the CPU, performs the control.

7. The wafer separating apparatus as recited in claim 1, wherein the separation structure comprises one or more claws.

8. The wafer separating apparatus as recited in claim 1, wherein the separation structure comprises a pin.

9. A wafer separating method comprising:
    after performing wafer processing in a state in which a wafer is electrostatically attracted and retained on an electrostatic chuck by an electrostatic attraction and retention voltage, setting the electrostatic attraction and retention voltage to zero, and thereafter applying a voltage having a same polarity as a polarity of the electrostatic attraction and retention voltage and a smaller magnitude than a magnitude of the electrostatic attraction and retention voltage, while applying a force to the wafer to separate the wafer from the electrostatic chuck.

10. The wafer separating method as recited in claim 9, wherein the force is applied to one end of the wafer.

11. The wafer separating method as recited in claim 9, further comprising measuring a parameter related to a residual electrostatic attraction and retention force, and controlling, based on a result of the measurement, the application of the force to separate the wafer.

12. The wafer separating method as recited in claim 9, further comprising controlling a clamp mechanism that supports the wafer with respect to the electrostatic chuck to release the support of the wafer by the clamp mechanism, after setting the electrostatic attraction and retention voltage to zero.

13. The wafer separating method as recited in claim 9, wherein the electrostatic attraction and retention voltage is a DC voltage.

14. The wafer separating method as recited in claim 9, wherein the wafer separating method is performed by a central processing unit (CPU).

15. The wafer separating method as recited in claim 9, wherein the force is applied by one or more claws.

16. The wafer separating method as recited in claim 9, wherein the force is applied by a pin.

* * * * *